US008687768B2

(12) United States Patent
Caiafa et al.

(10) Patent No.: US 8,687,768 B2
(45) Date of Patent: Apr. 1, 2014

(54) METHOD AND SYSTEM FOR PASSIVE RESONANT VOLTAGE SWITCHING

(75) Inventors: Antonio Caiafa, Niskayuna, NY (US); Peter Michael Edic, Albany, NY (US); Colin Richard Wilson, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 549 days.

(21) Appl. No.: 12/972,231

(22) Filed: Dec. 17, 2010

(65) Prior Publication Data

US 2012/0155614 A1    Jun. 21, 2012

(51) Int. Cl.
*H05G 1/32* (2006.01)
*H03K 3/00* (2006.01)

(52) U.S. Cl.
USPC .................................. 378/111; 307/132 R

(58) Field of Classification Search
USPC .............. 378/106, 110, 112, 101; 307/132 R; 363/28, 49
See application file for complete search history.

(56) References Cited

U.S. PATENT DOCUMENTS

| | | | |
|---|---|---|---|
| 4,614,999 A * | 9/1986 | Onodera et al. | 363/28 |
| 5,267,138 A * | 11/1993 | Shores | 363/98 |
| 5,661,774 A | 8/1997 | Gordon et al. | |
| 7,298,812 B2 | 11/2007 | Tkaczyk et al. | |
| 2009/0245467 A1 | 10/2009 | Wilson et al. | |
| 2010/0098217 A1 | 4/2010 | Caiafa et al. | |

OTHER PUBLICATIONS

Image Quality Optimization and Evaluation of Linearly Mixed Images in Dual-Source, Dual-Energy CT, Lifeng et, al., Medical Physics journal, 2009.
Image-Based Dual Energy CT Using Optimized Precorrection Functions: A Practical New Approach of Material Decomposition in Image Domain, Clemens et, al., Medical Physics journal, 2009.

* cited by examiner

*Primary Examiner* — Irakli Kiknadze
(74) *Attorney, Agent, or Firm* — The Small Patent Law Group; Evan R. Sotiriou; Jenifer E. Ward

(57) ABSTRACT

Methods and systems for passive resonant voltage switching are provided. One passive resonant switching system includes a voltage switching system having one or more passive resonant modules to provide a switching voltage output. Each of the passive resonant modules include switching devices configured to operate in open and closed states to produce first and second voltage level outputs from a voltage input. The passive resonant modules also include a capacitor connected to the one or more switching devices and configured to receive a system discharge energy during a resonant operating cycle when switching an output voltage from the first voltage level to the second voltage level, and to be recharged when switching from the second to first voltage level. The passive resonant modules further include a resonant inductor and an additional switching device.

20 Claims, 11 Drawing Sheets

METHOD AND SYSTEM FOR PASSIVE RESONANT VOLTAGE SWITCHING

BACKGROUND OF THE INVENTION

The subject matter disclosed herein relates generally to voltage switching systems, and more particularly, to methods and apparatus for voltage switching in imaging systems, such as diagnostic x-ray imaging systems.

In conventional computed tomography (CT) x-ray imaging systems, an x-ray source emits a cone-shaped beam of x-rays toward a subject or object, such as a patient. The beam, after being attenuated by the subject, impinges upon an array of radiation detectors. The intensity of the attenuated beam radiation received at the detector array is dependent upon the attenuation of the x-ray beam by the subject. Each detector element of the detector array produces a separate electrical signal indicative of the x-ray intensity received by that detector element. The electrical signals are quantized and transmitted to a data processing system for analysis, which ultimately produces an image.

CT imaging systems may comprise energy-discriminating (ED), multi-energy (ME), and/or dual-energy (DECT) imaging systems that may be referred to as an EDCT, MECT, and/or DECT imaging system. The EDCT, MECT, and/or DECT imaging systems are configured to measure energy-sensitive projection data. The energy-sensitive projection data may be acquired using multiple applied x-ray spectra by modifying the operating voltage of the x-ray tube or utilizing x-ray beam filtering techniques (e.g., energy-sensitive x-ray generation techniques), or by energy-sensitive data acquisition by the detector using energy-discriminating, or with photon counting detectors or dual-layered detectors (e.g., energy-sensitive x-ray detection techniques).

With x-ray generation techniques, various system configurations utilize modification of the operating voltage of the x-ray tube including: (1) acquisition of low-energy and high-energy projection data from two sequential scans of the object using different operating voltages of the x-ray tube, (2) acquisition of projection data utilizing rapid switching of the operating voltage of the x-ray tube to acquire low-energy and high-energy information for an alternating subset of projection views, or (3) concurrent acquisition of energy-sensitive information using multiple imaging systems with different operating voltages of the x-ray tube.

EDCT/MECT/DECT provides energy discrimination capability that allows material characterization. For example, in the absence of object scatter, the system utilizes signals from two applied photon spectra, namely the low-energy and the high-energy incident x-ray spectrum. The low-energy and high-energy incident x-ray spectra are typically characterized by the mean energies of the applied x-ray beams. For example, the low-energy x-ray spectrum comprises x-ray photons with lower-energy photons, resulting in a lower mean energy, relative to the high-energy x-ray spectrum. The detected signals from low-energy and high-energy x-ray spectra, either from two different applied spectra (x-ray generation techniques) or by regions of the same applied spectrum (x-ray detection techniques) provide sufficient information to estimate the effective atomic number of the material being imaged. Typically, x-ray attenuation mechanisms (Compton scattering or Photoelectric absorption) or the energy-sensitive attenuation properties of two basis materials (typically water and calcium for patient scanning) are used to enable estimation of the effective atomic number.

Dual-energy scanning can obtain diagnostic CT images that enhance contrast separation within the image by utilizing energy-sensitive measurements. To facilitate processing of the energy-sensitive measurements, the applied x-ray spectrum should be constant during an integration period. For example, such CT systems that acquire interleaved subsets of low-energy and high-energy projection data (versus two separate scans) should operate to maintain the accelerating voltage steady during an acquisition interval. Also, the change from one voltage level to another voltage level should occur very rapidly. Less stable x-ray tube operating voltages and/or slower operating voltage switching times result in a reduction in the difference in effective mean energy (the average of the mean energies of time-varying x-ray spectra) of the applied x-ray spectra, which reduces the fidelity of the system in characterizing different materials.

Thus, while switching the x-ray tube potential (voltage), for example, by using high-frequency generators, may solve some of the problems related to conventional dual-energy scanning (acquiring energy-sensitive projection data on alternate scans of the object), such a configuration does not always provide the switching speed needed for certain imaging applications. For example, cardiac imaging cannot be effectively performed by simply switching the x-ray source potential between two sequential scans of the human thorax due to cardiac motion. Furthermore, for systems utilizing rapid switching of the x-ray potential for subsets of projection angles, the switching speed of the x-ray tube potential may not be sufficient for the fast gantry rotation speeds required to freeze motion for cardiac imaging. There is often a delay in the response time of the switched operating potential between the high-frequency generator and the x-ray tube, due in part to the capacitance of the cable connecting the device and the x-ray tube.

The delay in response time is dependent on the x-ray beam current of the x-ray tube as the beam current also either helps or hinders the discharge of the associated capacitance. Accordingly, the rise time in switching the generator from a first (low) voltage, or low kVp, level to a second (high), or high kVp, level is limited by the power of the high-voltage generator, which may be suboptimal for dual-energy imaging in many medical applications. Similarly, the fall time between switching the high kVp to a low kVp level is generally very slow due to the need to discharge the system capacitance, which effectively reduces the energy separation of the applied spectra, resulting in reduced material specification sensitivity and, therefore, the effectiveness of the dual-energy imaging. As such, these insufficient switching speeds often lead to projection data pair mis-registration and streak artifacts in reconstructed images. Additionally, many industrial CT systems for baggage inspection utilize stationary anode tube configurations with x-ray beam currents that are an order of magnitude or more lower than x-ray beam currents used with medical CT system employing rotating-anode technology. As such, the time required to switch the operating voltage of the x-ray tube is prohibitively long.

For radiographic x-ray imaging systems, the limitations mentioned above also apply. Radiographic x-ray systems acquire one or more views of the imaged object, which may be presented as two-dimensional projection images, or in some cases where several more projection data are acquired, as three-dimensional images generated using tomosynthesis techniques. The aforementioned limitations regarding switching speed apply to x-ray radiographic or tomosynthesis systems, such as due to the capacitance of the high-voltage cable connecting the generator to the x-ray tube, the x-ray tube capacitance itself, the power of the generator, and the x-ray beam current, which may all limit switching speed. The capacitance of the high-voltage cable and the x-ray tube are considered the system or main capacitance.

BRIEF DESCRIPTION OF THE INVENTION

In accordance with various embodiments, a voltage switching system is provided having a plurality of passive resonant modules to provide a switching voltage output. Each of the passive resonant modules include a pair of switching devices configured to operate in open and closed states to produce first and second voltage level outputs from a voltage input and a pair of diodes connected to the pair of switching devices, with the pair of diodes configured as blocking diodes. The passive resonant modules also include a capacitor. The capacitor is connected to the pair of switching devices and configured to receive a discharge energy from the system capacitance during a resonant operating cycle when switching an output voltage from the first voltage level to the second voltage level, wherein the capacitor is further configured to be recharged when switching from the second to first voltage level. The passive resonant modules further include a resonant inductor configured to transfer energy to and from the capacitor. The passive resonant modules also include a third switching device, wherein the third switching device is connected in series with the pair of switching devices and two of the switching devices are configured to be in a same state, which is different than a state of the other one of the switching devices. The voltage switching system additionally may be connected to an x-ray tube.

In accordance with other various embodiments, a high voltage generator system is provided that includes a voltage source and a passive resonant interposer circuit connected to the voltage source. The passive resonant interposer circuit includes a plurality of passive resonant switching modules configured to output two different voltage levels using resonant switching, wherein discharged energy is stored and reused during the resonant switching cycles, and the passive resonant switching modules are rechargeable at only one of the voltage levels. An x-ray tube also is connected to an output of the passive resonant circuit and configured to operate at two different energy levels when powered by the two different voltage levels.

In accordance with yet other various embodiments, a method for controlling voltage switching is provided. The method includes configuring a plurality of switching devices to switch states during resonance operation to provide passive resonant voltage switching. The method also includes providing a plurality of diodes in connection with the plurality of switching devices to operate as blocking diodes and providing a capacitor to store discharged energy during a resonant cycle of the resonance operation and being rechargeable at only one of the states. The method further includes powering an x-ray tube at different energy levels using the plurality of switches.

DETAILED DESCRIPTION OF THE INVENTION

Figure 1:
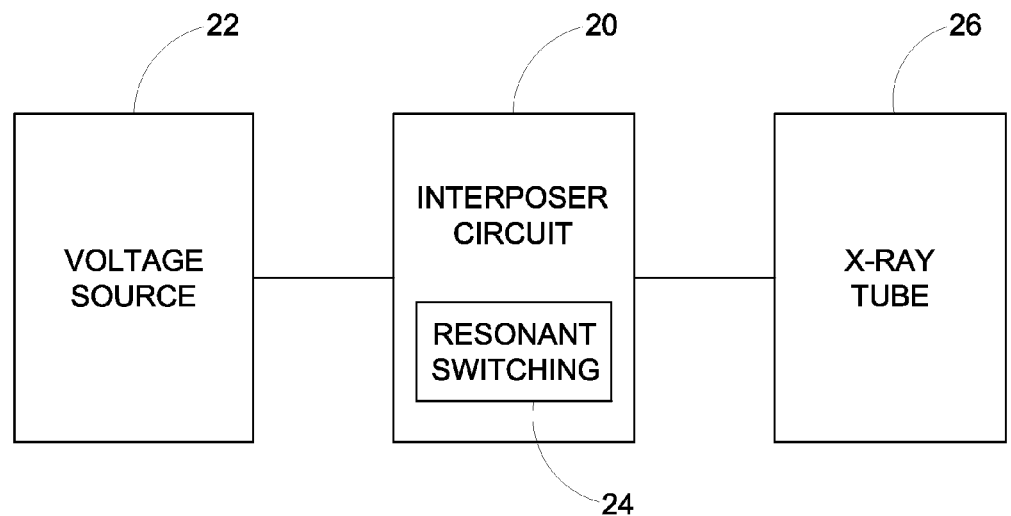
FIG. 1 is a simplified block diagram of a switching architecture having an interposer circuit according to an embodiment of the invention.

The foregoing summary, as well as the following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

The various embodiments are described herein within a particular operating environment including a particular imaging system, such as a "third generation" computed tomography (CT) system (e.g., a sixty-four-slice CT system). It should be appreciated by one skilled in the art that embodiments of the invention are equally applicable for use with other configurations and systems, such as for medical and baggage scanning systems. For example, the embodiments are applicable to x-ray radiographic imaging systems as well as x-ray tomosynthesis imaging systems. Additionally, embodiments of the invention will be described with respect to the detection and conversion of x-rays. However, one skilled in the art will further appreciate that embodiments of the invention are equally applicable for the detection and conversion of other high frequency electromagnetic energy. Also, the x-ray tube and detector are described to rotate around the object being imaged, but alternate configurations wherein the detector and x-ray source are held stationary and the object is rotated are also contemplated, such as is used for industrial non-destructive testing purposes. Hence, although discussed in the context of CT systems, the various embodiments may be applied to projection x-ray imaging used in other medical and industrial radiographic applications as well.

Various embodiments provide a switching architecture including an passive resonant interposer circuit configured to switch or assist in switching between a first voltage level and a second voltage level. For example, the various embodiments provide switching between a low kilovolt (kV) level, applied by a generator, to a high kV level with a stable voltage during the scanning integration period. The interposer circuit provides resonant switching with energy recovery such that the energy used going from a high kV level is recovered when returning to a low kV level, then reused again and recirculated when going from the low kV level to the high kV level. By practicing various embodiments, fast switching between the first voltage level and the second voltage level (e.g., high and low voltage levels) is achieved. The embodiments enable improved separation in the mean energy of applied x-ray spectra, thereby improving material decomposition and effective atomic number estimation of a scanned object. Additionally, the various embodiments may be implemented in systems where the voltage to be switched is very large (e.g., 200 kV or greater), the parasitic capacitances to ground are also very large, or the energy required by the load is relatively small, as is the case for industrial inspection systems utilizing stationary anode x-ray tube technology. Additionally, because of the resonant transitions, the described embodiments may reduce electromagnetic interference (EMI).

As illustrated in FIG. 1, a switching architecture in one embodiment includes a passive resonant interposer circuit 20 (hereafter referred to as the interposer circuit 20) connected to a voltage source 22 (e.g., a high voltage generator) and an x-ray tube 26. The interposer circuit 20, which may be configured as a module, includes resonant switching component (s) 24 that facilitate switching of the voltage generated from the voltage source 22 and applied to an x-ray tube 26. For example, in operation, the interposer circuit 20 with the resonant switching component 24 provides switching between a high kV level (e.g., 140 kV) and a low kV level (e.g., 80 kV) during resonance. However, it should be noted that other high and low voltage levels may be provided and the various embodiments are not limited to a particular voltage level. As another example, the high kV level can range from a few tens of kV (e.g., ~30 kV for mammography) to hundreds of kV (e.g., ~450 kV for industrial inspection applications). The energy is reused and recirculated when switching between the voltage levels energy, which saves the energy and allows faster switching. In some embodiments, switching between the voltage levels is provided in about 10-100 microseconds or less.

Figure 2:
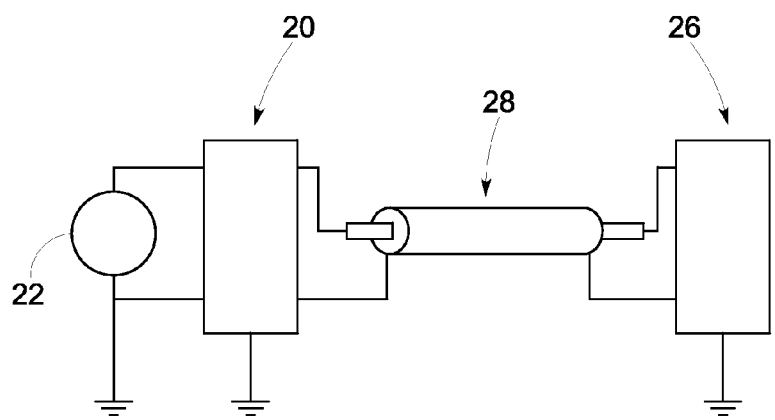
FIG. 2 is a block diagram showing a connection arrangement for an interposer circuit according to an embodiment of the invention.
Figure 3:
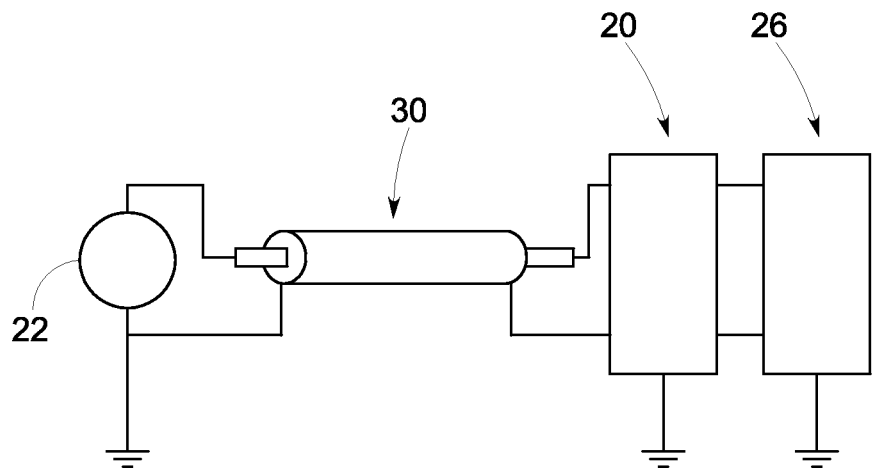
FIG. 3 is a block diagram showing a connection arrangement for an interposer circuit according to another embodiment of the invention.
Figure 4:
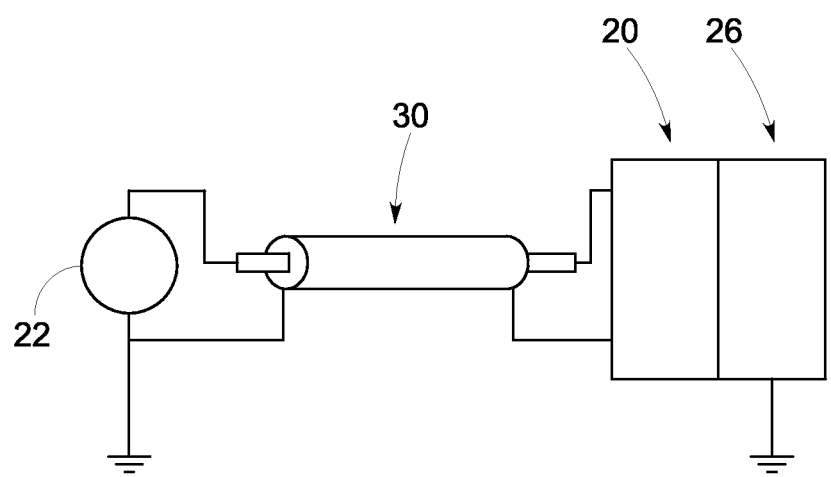
FIG. 4 is a block diagram showing a connection arrangement for an interposer circuit according to another embodiment of the invention.

The embodiment illustrated in FIG. 1 includes the interposer circuit 20 connected to the voltage source 22, such as in an add-on configuration. The various embodiments are not limited to such a configuration and switching architecture. Specifically, FIGS. 2 through 4 illustrate the interposer circuit 20 connected in different configurations. The particular configuration selected may be based on the arrangement of the x-ray system in connection with which voltage switching is implemented.

Specifically, FIG. 2 illustrates an embodiment wherein the interposer circuit 20 is provided in proximity and connected to the voltage source 22 and connected to the x-ray tube via a length of cable 28. It should be noted that a cable (not shown) is also provided to connect the interposer circuit 20 to the voltage source 22, which in this embodiment is shorter than the cable 28. The cable 28 connecting the interposer circuit is rated for a higher voltage operation than the cable 30 illustrated in FIGS. 3 and 4. For example, the cable 28 in this embodiment is rated at the higher voltage level, such as 140 kV.

FIG. 3 illustrates the interposer circuit 20 in proximity and connected to the x-ray tube 26. In this embodiment, a length of cable 30 connects the interposer circuit 20 and the voltage source, such that the cable 30 is rated for a lower voltage operation than the cable 28 shown in FIG. 2, for example, 80 kV. The interposer circuit 20 also may be coupled directly to the x-ray tube 26, for example, by bolting the two components together, as shown in FIG. 4. However, in all three of the embodiments illustrated in FIGS. 2 through 4, the interposer circuit 20 is a separate unit connected to the system. It should be noted that the cable 28 or 30 is generally a high-voltage cable.

The embodiments illustrated in FIGS. 2 through 4 are a passive configuration. Accordingly, the system is capable of providing energy at only one voltage level, in particular, a low voltage level as described in more detail herein. Accordingly, the voltage source 22 is a high voltage generator capable of generating voltages corresponding to low levels, for example, 80 kV, and the interposer circuit 20 provides the extra energy/ power needed to operate the load (e.g., vacuum chamber) at a high voltage level, for example, 140 kV. The interposer circuit 20 operates to discharge energy from the system capacitance when switching from a high voltage level to a low voltage level, and restore the energy using energy reuse when transitioning to the next high voltage energy cycle. The switching of the interposer circuit 20 uses the energy that is resonantly discharged through an inductor and a capacitor instead of through the load to provide fast switching in various embodiments (e.g., 10-100 microseconds or less).

Figure 5:
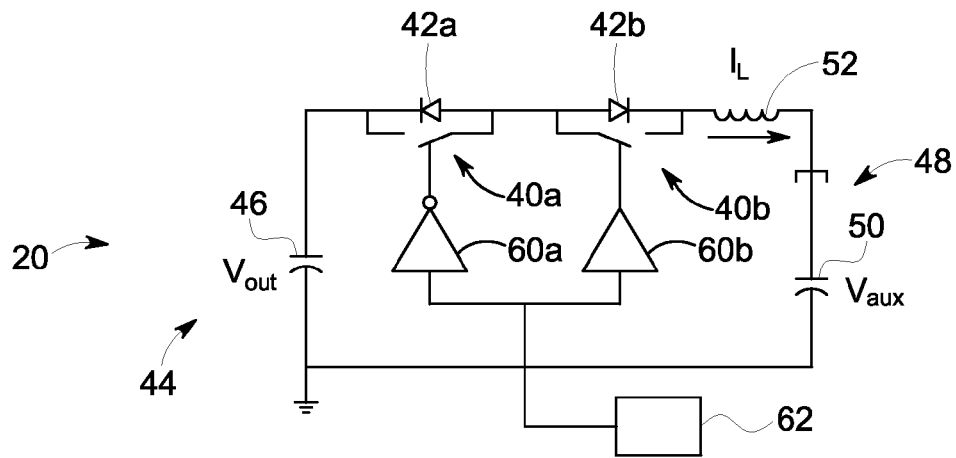
FIG. 5 is a simplified circuit schematic diagram illustrating operation of various embodiments of the invention.

Specifically, the operation, including the working principle of various embodiments is illustrated in the schematic of FIG. 5. The schematic represented in FIG. 5 includes a plurality of switching devices 40a and 40b connected in series. The switching devices 40a and 40b may be any type of switches. For example, the switching devices 40a and 40b may be metal-oxide-semiconductor field-effect transistors (MOSFETs) or insulated gate bipolar transistors (IGBTs). As illustrated by the buffers 60a and 60b, the switching devices 40a and 40b are operated opposite to one another (only one switch is closed at a time). Accordingly, when a control signal from a driver 62 (e.g., a logic clock) is transmitted to the switching devices 40a and 40b, one of the switching devices 40a and 40b receives the opposite drive signal such that one of the switching devices 40a and 40b is in an open state and one of the switching devices 40a and 40b is in a closed state. In various embodiments, the switching devices 40a and 40b are connected in a common source/emitter configuration to allow control by a single control line from the driver 62.

Each of the switching devices 40a and 40b is connected in parallel with a diode 42a and 42b, respectively, that operates as a blocking diode. The switching devices 40a and 40b are connected between a main capacitor 46 and an auxiliary capacitor 50. An inductor 52 is also connected in series between the capacitor 50 and the diode 40b. It should be noted that the inductor 52 also might be referred to as a resonant inductor.

The principle of operation, as described in more detail below, is such that energy is resonantly transferred from one capacitor to another capacitor, for example from capacitor 46 to capacitor 50, and vice versa. The switching speed of the transition between voltage levels is controlled by the inductor 52, and the capacitors 46 and 50. The inductor 52, and the capacitors 46 and 50 operate as resonant elements. In practice, and in some embodiments, the values of the capacitors 46 and 50 are set by the geometrical size of the connecting cable and vacuum tube, therefore the switching speed from one voltage level to another, is determined by the value of the inductor 52. For example, the smaller the value of the inductor 52, the faster the transition of the switching between high to low voltage, and vice versa. The transition speed of the devices 40a and 40b (in opening or closing) in various embodiments is much faster than the voltage transition speed.

As an example, when the voltage across the main capacitor 46 ($V_{out}$) is a high voltage level, the switching device 40a is in an open state and the switching device 40b is in a closed state. In this high voltage state, when the switching device 40a operates as a short, energy transfer from the main capacitor 46 to the auxiliary capacitor 50 occurs. The transition from the high voltage state to a low voltage state, wherein the output voltage 44 decreases from a high voltage level to zero voltage level, is accomplished by switching of the switching devices 40a and 40b. In particular, the switching device 40a switches from an open state to a closed state and the switching device 40b switches from a closed state to an open state. It should be noted that the switching of the switching devices 40a and 40b is provided in parallel based on the signal from the driver 62. The switching of the switching devices 40a and 40b causes the resonance state to start and the energy in the capacitor 46 is transferred to the capacitor 50, through the inductor 52, for storage until the next high-voltage state is desired. When high voltage is desired, a resonant energy transfer from the capacitor 50 to the capacitor 46, through resonant inductor 52, is restarted by opening the switching device 40a and closing the switching device 40b, such that the energy stored in the capacitor 50 is transferred to the capacitor 46.

Figure 6:
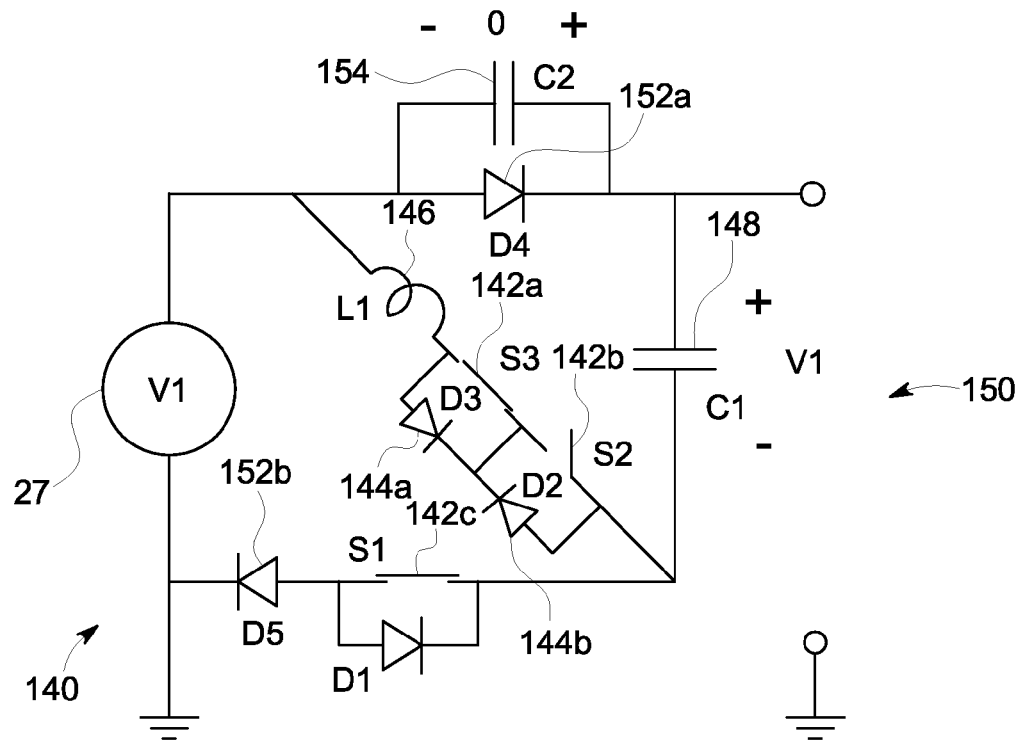
FIG. 6 is a schematic diagram of an interposer circuit in accordance with various embodiments in an off state.

The switching operation of various embodiments may be implemented in a passive configuration as illustrated in FIGS. 6 through 10. In this passive configuration, energy reuse using resonance energy transfer is also provided. FIG. 6 illustrates an off state of an interposer circuit 140, which may be implemented in a configuration as shown in FIG. 1 as an add-on component. The interposer circuit 140 includes a pair or series connected switching device 142a and 142b in connection with a switching device 142c, a voltage source 27, an inductor 146 and a diode 152b. The anti-parallel connected switching devices 142a and 142b are connected to a pair of back to back diodes 144a and 144b. The switching devices 142a and 142b are connected in series with an inductor 146. A pair of diodes 152a and 152b are also connected opposite to one another and parallel to the switching devices 142a and 142b. A capacitor 154 is also connected in parallel with the diode 152a. The off state of the interposer circuit 140 defines a low voltage level, for example, 80 kV. It should be noted that the voltage source 27 represents the voltage between ground and the voltage output 150. In this state, the switching devices 142a and 142c are closed and switching device 142b is open.

Figure 7:
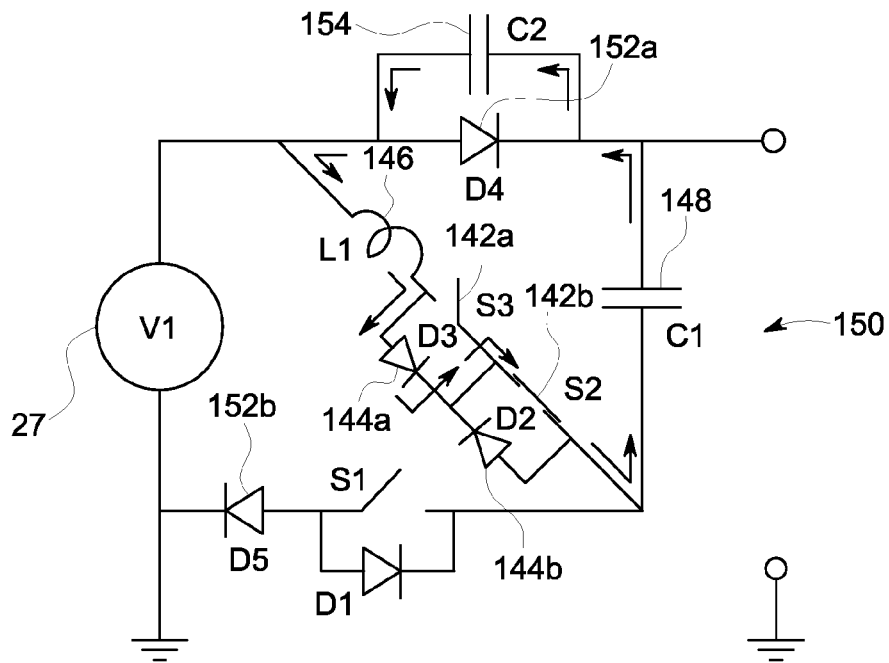
FIG. 7 is a schematic diagram of the interposer circuit of FIG. 6 in a resonant state.

As illustrated in FIG. 7, during resonant operation, the capacitor 154 is charging, thereby starting the resonant cycle. During this resonant cycle, the capacitor 148 is discharging with the diode 144a preventing the voltage from going negative. During this resonant operation, the energy from the capacitor 148 is transferred to the capacitor 154. It should be noted that the capacitors 148 and 154 have the same value. In this resonant state, the switching devices 142a and 142c are open and the switching device 142b is closed. This resonant cycle recharges the capacitor 154 to result in a high voltage level.

Figure 8:
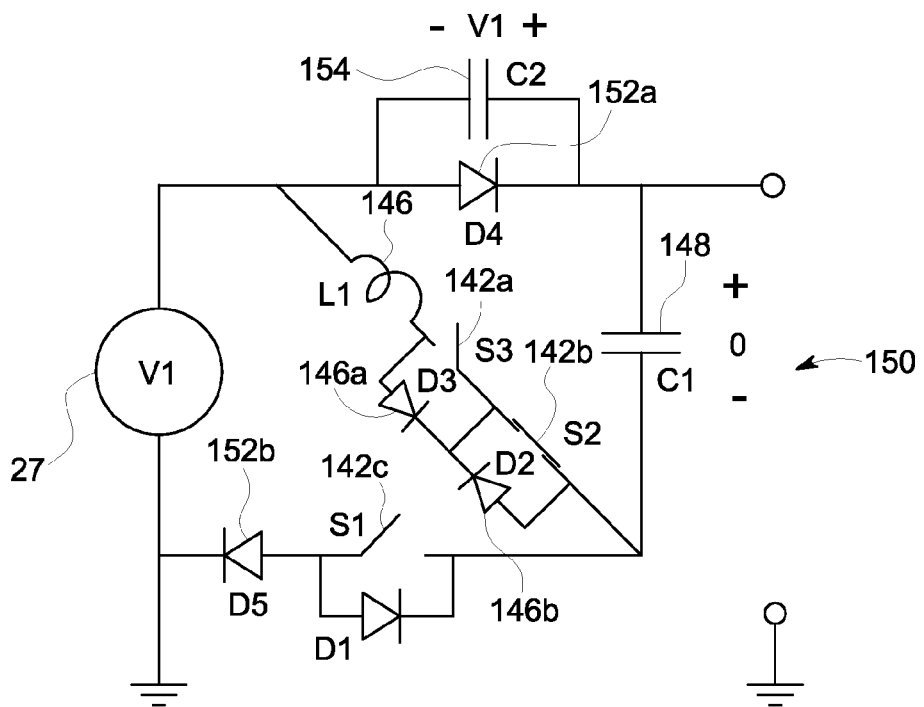
FIG. 8 is a schematic diagram of the interposer circuit of FIG. 6 in an on state.

As illustrated in FIG. 8, with the capacitor 154 now charged, there is no load on the system. Accordingly, this steady state may be maintained. If a load is added, the capacitor 154 discharges. In this state, the output voltage 150 may be double the input voltage at the voltage source 27.

Figure 9:
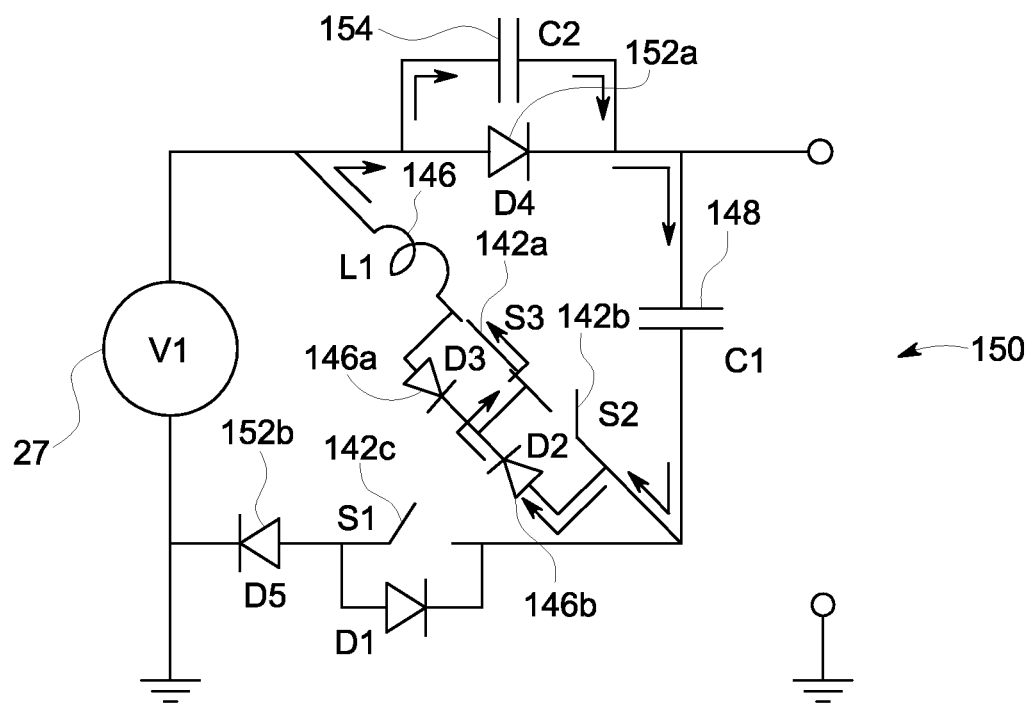
FIG. 9 is a schematic diagram of the interposer circuit of FIG. 6 in another resonant state.

As illustrated in FIG. 9, in a resonant discharge cycle, wherein switching device 142a is closed and switching devices 142b and 142c are open, the energy in capacitor 148 is transferred to capacitor 154 for later reuse at the next high voltage level. Accordingly, the resonant transition is restarted in this arrangement of the switching devices. The interposer circuit 140 is then switched to the off state configuration illustrated in FIG. 6 wherein the capacitor 148 is recharged through the switching device 142c, which switch is closed after the resonant transition is completed.

Figure 10:
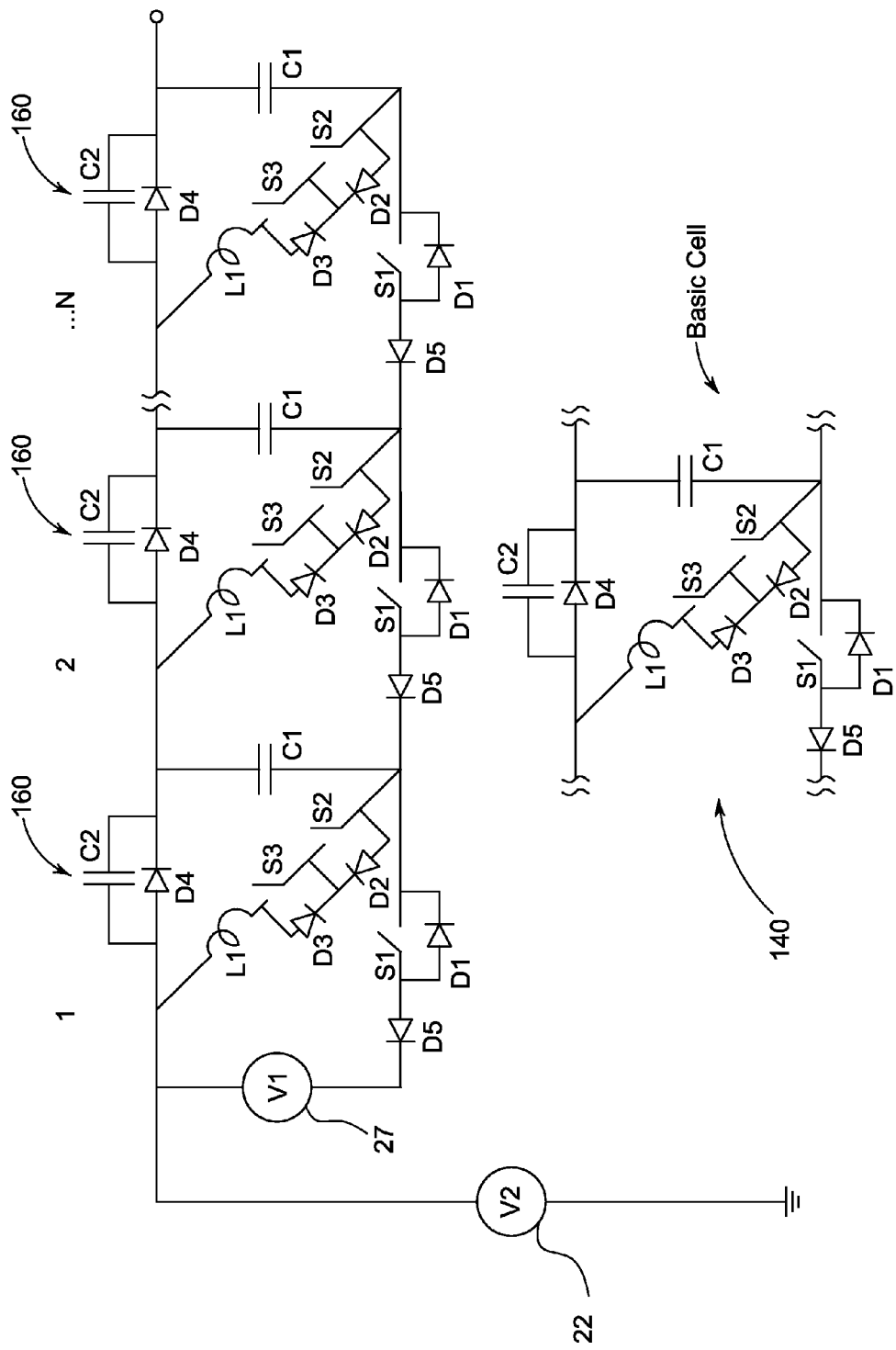
FIG. 10 is a schematic diagram of a multi-stage interposer circuit in accordance with various embodiments.

As illustrated in FIG. 10, a plurality of stages 160 may be formed from a plurality of interposer circuits 140 (illustrated as defining a basic cell) such that the output voltage is a multiple of the input voltage. For example, if three stages are provided, the maximum voltage is three times the voltage V1 plus the input voltage (or low level voltage) V2. Thus, when all of the capacitors 154 are discharged, the output voltage 162 is equal to the voltage of the voltage source 22 (V2). When the capacitors are charged, the output voltage 162 is V2+(N×V1), where N is the number of stages.

Figure 11:
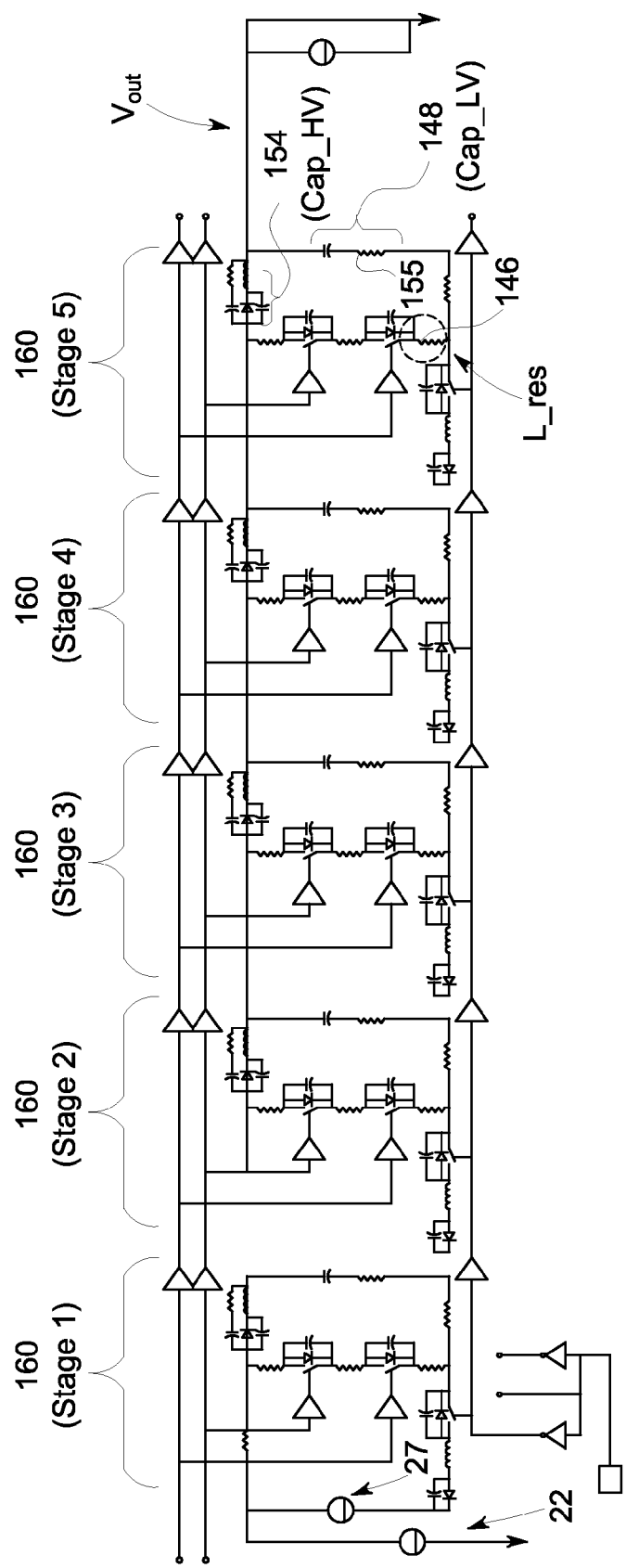
FIG. 11 is a schematic diagram of a multi-stage interposer circuit in accordance with other various embodiments.

The number of stages 160 may be varied. For example, FIG. 11 illustrates five stages 160. Although, more of less stages 160 may be provided, for example, forty stages. As illustrated in FIG. 11, two constant voltage sources 22 and 27 may be provided, which may provide a constant voltage levels, such as 100 kV and 3 kV, respectively. In operation, when the input and output voltages are at 100 kV, the capacitors 154 are at 0 kV and the capacitors 148 are at 3 kV. It should be noted that FIG. 11, thus, illustrates five stages and may include additional components as should be appreciated by one skilled in the art (e.g., resistors 155) to provide improved system performance (e.g., reduced noise). Additionally, similar parts throughout the Figures are not necessarily separately numbered for simplicity and ease in viewing.

Figure 12:
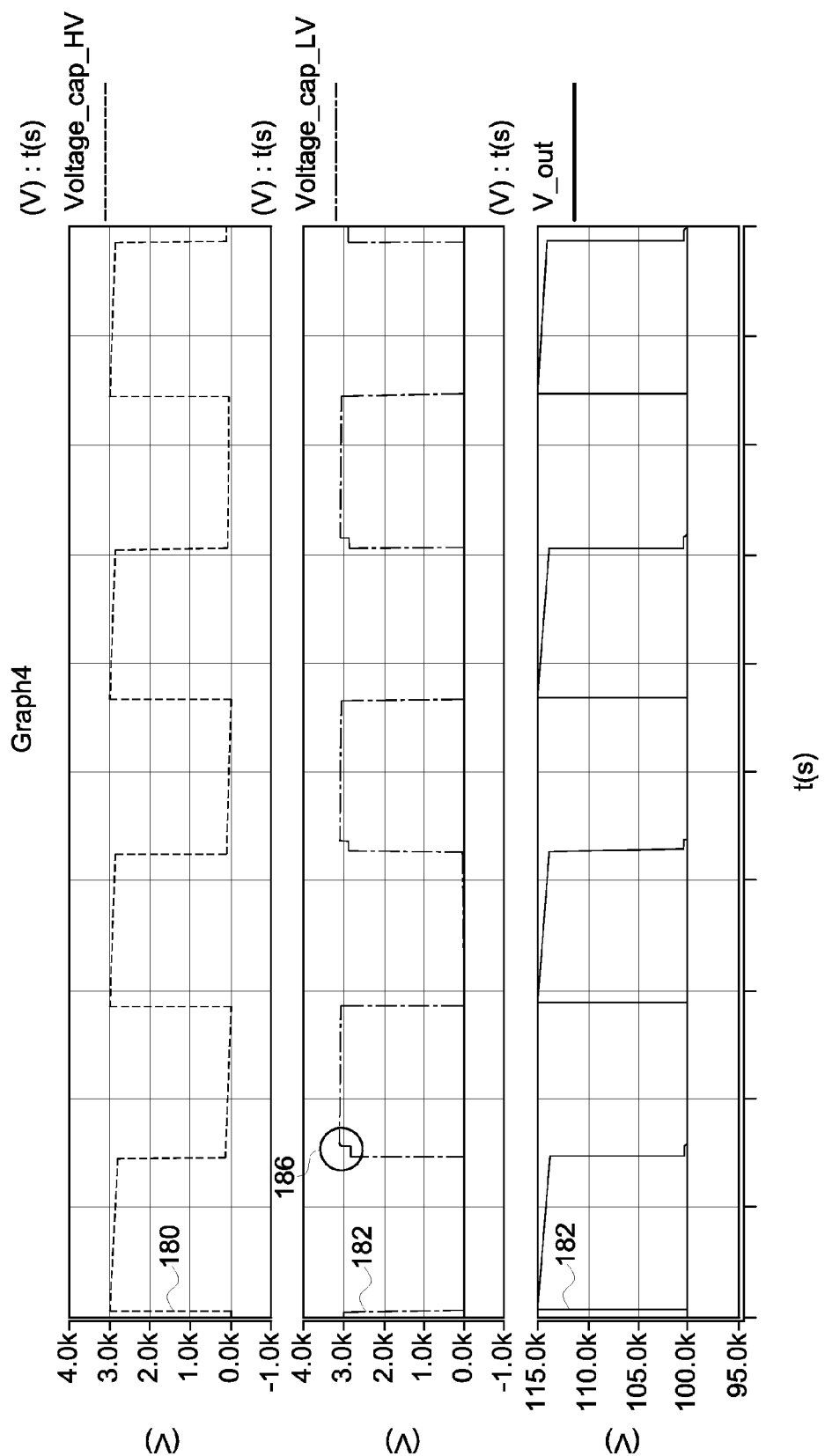
FIG. 12 are graphs of waveforms referenced to an output voltage in accordance with other various embodiments.

FIG. 12 illustrates graphs of waveforms of voltages changes in accordance with various embodiments. The waveforms are referenced to the output voltage. The graph 180 represents the voltage waveform at the capacitor 154 (shown in FIG. 11) and the graph 182 represents the voltage waveform at the capacitor 148 (shown in FIG. 11). The graph 184 represents the voltage waveform at the output ($V_{out}$ in FIG. 11).

It should be noted that the change in the waveform indicated at 186 in the graph 182 is due to the closing of switch 142c and represents the replenishing or recharging of the capacitors 148 after the discharging resonant cycle is over. Additionally, the slight sloping of the higher steps of the waveform in graph 184 is a result of a discharge due to the load current.

As can be seen by the graph 184, with five stages, each contributes a voltage gain of 3 kV, such that the upper end of the waveform is 15 kV higher than the lower end. Accordingly, a 3 kV per stage increase is provided, such that the output voltage is about 115 kV based on an input voltage of 100 kV.

Figure 13:
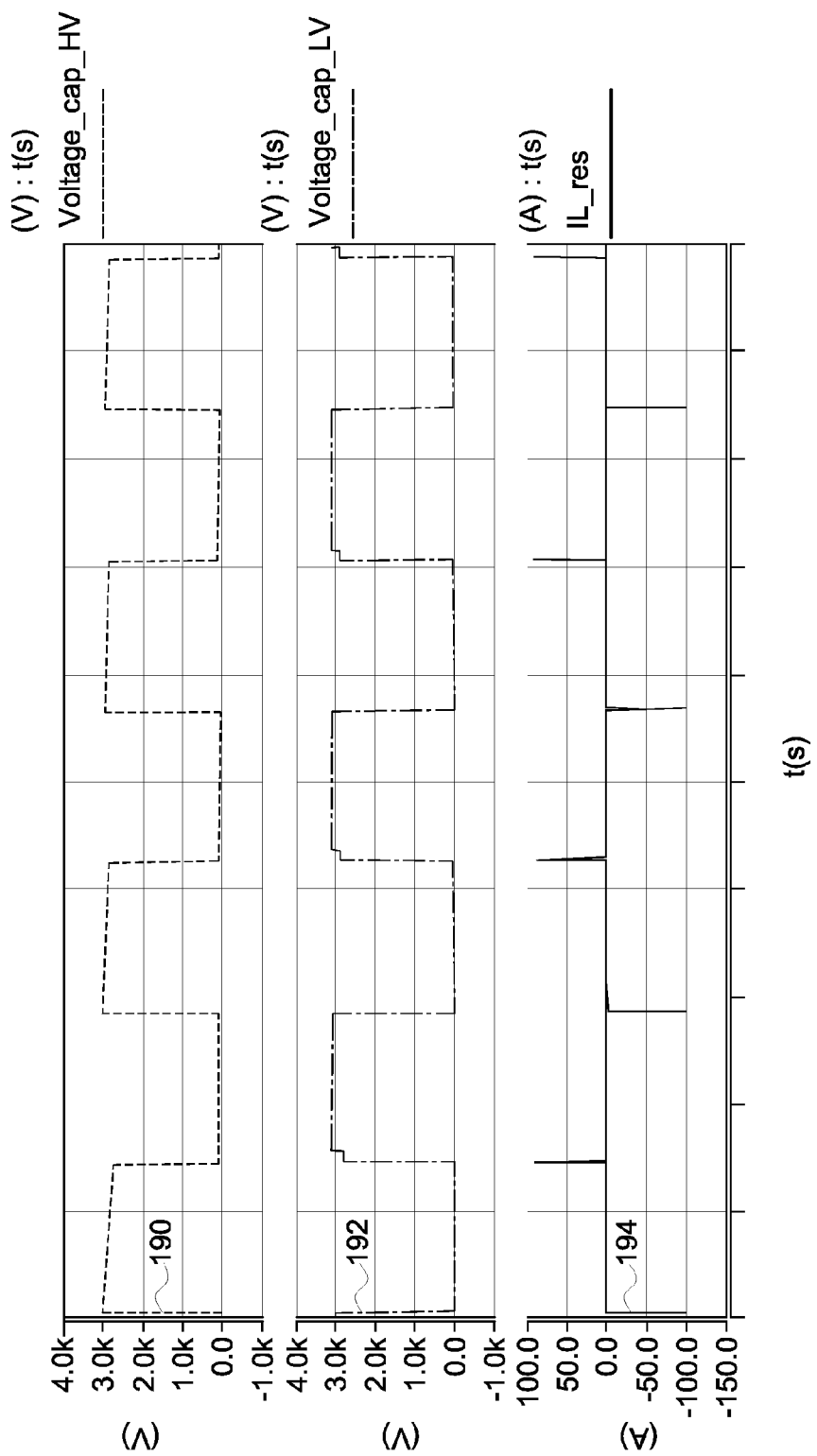
FIG. 13 are graphs of waveforms referenced to a resonant current in accordance with other various embodiments.

FIG. 13 illustrates graphs of waveforms of voltages changes in accordance with various embodiments. The waveforms are now referenced to the resonant current. The graph 190 represents the voltage waveform across the capacitors 154 (shown in FIG. 11) and the graph 192 represents the voltage waveform across the capacitors 148 (shown in FIG. 11). The graph 194 represents the current waveform through the inductor 146 ($L_{res}$ in FIG. 11).

Thus, various embodiments provide a switching architecture having an interposer providing switching using energy reuse. The transition between energy levels is provided during resonant operation.

Figure 15:
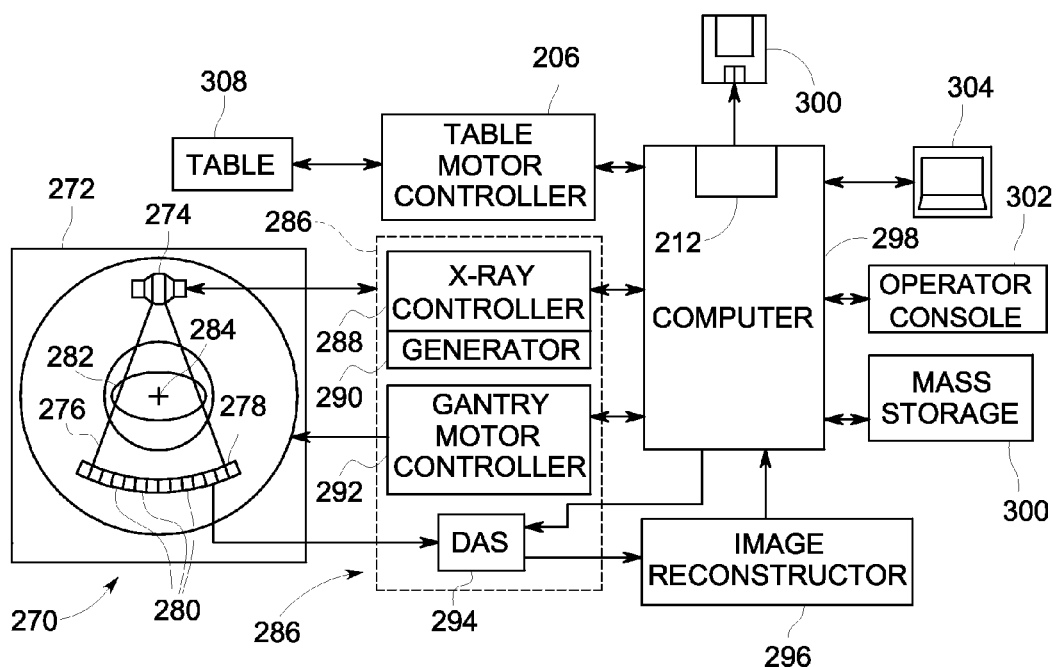
FIG. 15 is a block schematic diagram of the CT imaging system of FIG. 14.
Figure 16:
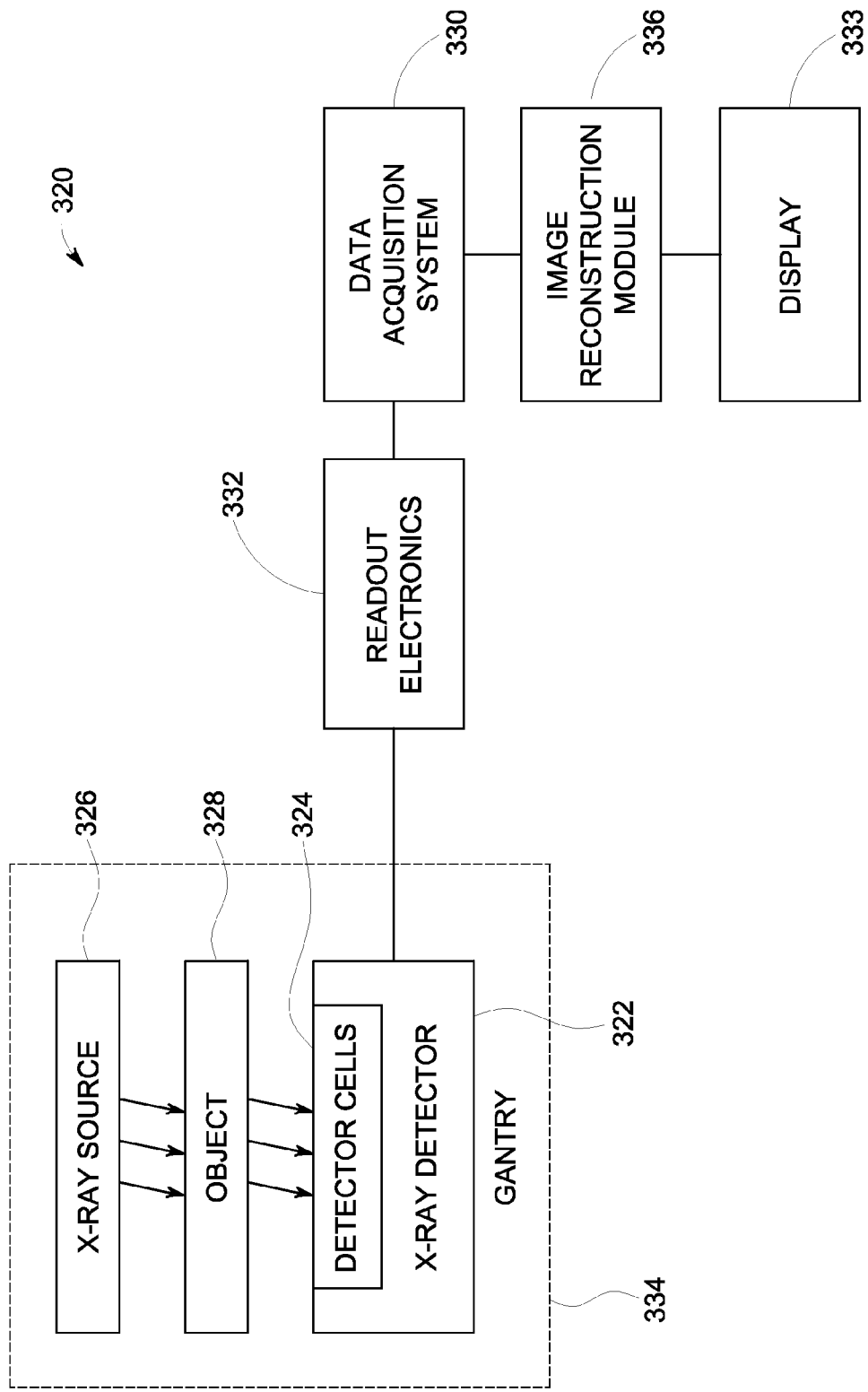
FIG. 16 is a schematic block diagram of an x-ray imaging system in connection with which various embodiments may be implemented.

The various embodiments may be implemented in different systems using high-voltage sources. For example, the various embodiments may be implemented in connection with a CT imaging system as shown in FIGS. 14 and 15, an x-ray imaging system as shown in FIG. 16, which may be a radiographic or x-ray tomosynthesis system.

Figure 14:
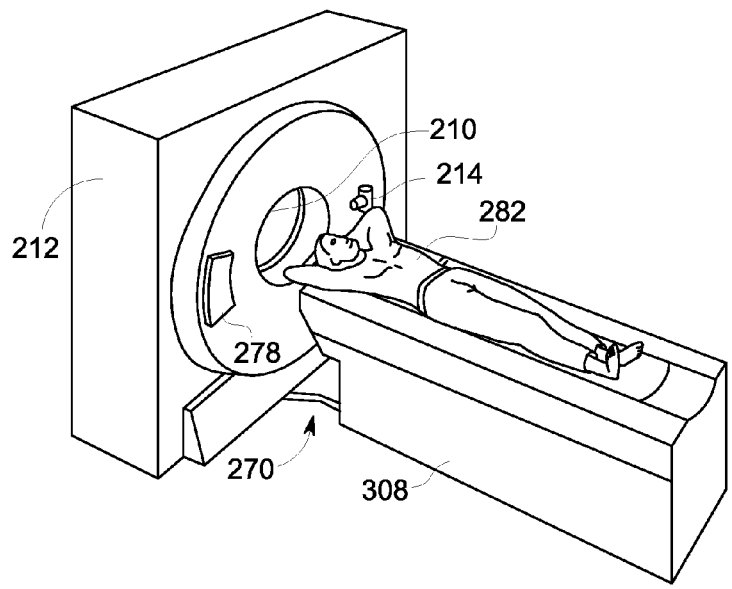
FIG. 14 is a pictorial view a computed tomography (CT) imaging system in connection with which various embodiments may be implemented.

In particular, FIG. 14 is a pictorial view of a CT imaging system 270. FIG. 15 is a block schematic diagram of the system 270 illustrated in FIG. 14. In the exemplary embodiment, the CT imaging system 270 is shown as including a gantry 272 representative of a "third generation" CT imaging system. The gantry 272 has an x-ray source 274 that projects a cone beam 276 of x-rays toward a detector array 278 on the opposite side of gantry 272.

The detector array 278 is formed by a plurality of detector rows (not shown) including a plurality of detector elements 280 that together sense the projected x-ray beams that pass through an object, such as a medical patient 282 or piece of baggage. Each detector element 280 produces an electrical signal that represents the intensity of an impinging x-ray radiation beam and hence the attenuation of the beam as it passes through object or patient 282. The imaging system 270 having a multislice detector 278 is capable of providing a plurality of images representative of a volume of object or patient 282. Each image of the plurality of images corresponds to a separate "slice" of the volume. The "thickness" or aperture of the slice is dependent upon the height of the detector rows.

During a scan to acquire x-ray projection data, a rotating portion (not shown) within the gantry 272 and the components mounted thereon rotate about a center of rotation 284. FIG. 15 shows only a single row of detector elements 280 (i.e., a detector row). However, the multislice detector array 278 includes a plurality of parallel detector rows of detector elements 280 such that projection data corresponding to cone-beam geometry can be acquired simultaneously during a scan.

Rotation of the gantry 272 and the operation of radiation source 274 are governed by a control mechanism 286. The control mechanism 286 includes an x-ray controller 288 and generator 290 that provides power and timing signals to the x-ray source 274 and a gantry motor controller 292 that controls the rotational speed and position of rotating portion of gantry 272. A data acquisition system (DAS) 294 in the control mechanism 286 samples analog data from detector elements 280 and converts the data to digital signals for subsequent processing. An image reconstructor 296 receives sampled and digitized measurement data from the DAS 294 and performs high-speed image reconstruction. The reconstructed image is applied as an input to a computer 298 that stores the image in a mass storage device 300. Although shown as a separate device, image reconstructor 296 may be special hardware located inside computer 298 or software executing within computer 298.

The computer 298 also receives commands and scanning parameters from an operator via a console 302 that has a keyboard and/or other user input device(s). An associated display system 304 allows the operator to observe the reconstructed image and other data from the computer 298. The operator supplied commands and parameters are used by the computer 298 to provide control signals and information to the DAS 294, x-ray controller 288, generator 290 and gantry motor controller 292. In addition, the computer 298 operates a table motor controller 306 that controls a motorized table 308 to position the patient 282 or object in the gantry 272. The table 308 moves portions of the patient 282 through a gantry opening 310.

In one embodiment, the computer 298 includes a device 312, for example, a floppy disk drive, CD-ROM drive, DVD-ROM drive, or a solid state hard drive for reading instructions and/or data from a computer-readable medium 314, such as a floppy disk, CD-ROM, or DVD. It should be understood that other types of suitable computer-readable memory are recognized to exist (e.g., CD-RW and flash memory, to name just two), and that this description is not intended to exclude any of these. In another embodiment, the computer 298 executes instructions stored in firmware (not shown). Generally, a processor in at least one of the DAS 294, reconstructor 296, and computer 298 shown in FIG. 19 is programmed to execute control commands to perform switching as described in more detail herein. The switching is not limited to practice in the CT system 270 and can be utilized in connection with many other types and variations of imaging systems. In one embodiment, the computer 298 is programmed to perform different functions to switch the switching devices described herein, accordingly, as used herein, the term computer is not limited to just those integrated circuits referred to in the art as computers, but broadly refers to computers, processors, microcontrollers, microcomputers, programmable logic controllers, application specific integrated circuits, and other programmable circuits.

FIG. 16 illustrates an x-ray imaging system 320 in which various embodiments may be implemented. The imaging system 320 generally includes an x-ray detector 322 having an array of detector cells 324 defining a scan area, and an x-ray source 326. An object 328, such as a patient or piece of luggage is positioned between the x-ray source 326 and the x-ray detector 322, which may be one or more detectors or detector modules. However, the imaging system 320 may also scan other objects, such as in an industrial inspection application. The imaging system 320 also includes a data acquisition system 330 which interacts with readout electronics 332. The readout electronics 332 may reside inside x-ray detector 322 or the data acquisition system 330.

In one embodiment, the x-ray detector(s) 322 may be flat-panel detector systems such as an amorphous silicon flat panel detector or other type of digital x-ray image detector, such as a direct conversion type detector, as is known to those skilled in the art. In another embodiment, the x-ray detector(s) 322 may include a scintillator having a screen that is positioned in front of the x-ray detector(s) 322.

It should be noted that the imaging system 320 may be implemented as a non-mobile or mobile imaging system. Moreover, the imaging system 320 may be provided in different configurations. For example, image data may be generated with the x-ray source 326 at discrete foci along a small arc above the object to generate the image information using computed tomosynthesis procedures and processes (or may be in a radiographic configuration). In other embodiments, the x-ray source 326 and the x-ray detector 322 are both mounted at opposite ends of a gantry 334, which may be a C-arm that rotates about the object 328. The rotatable C-arm is a support structure that allows rotating the x-ray source 326 and the x-ray detector 322 around the object 328 along a substantially circular arc, to acquire a plurality of projection images of the object 328 at different angles (e.g., different views or projections) that are typically less than 360 degrees, but may comprise a complete rotation in some instances.

In operation, the object 328 is positioned in the imaging system 320 for performing an imaging scan. For example, the x-ray source 326 may be positioned above, below or around the object 328. For example, the x-ray source 326 (and the x-ray detector(s) 322) may be moved between different positions around the object 328 using the gantry 334. X-rays are transmitted from the x-ray source 326 through the object 328 to the x-ray detector(s) 322, which detect x-rays impinging thereon.

The readout electronics 332 may include a reference and regulation board (RRB) or other data collection unit. The RRB may accommodate and connect data modules to transfer data (e.g., a plurality of views or projections) from the x-ray detector(s) 322 to the data acquisition system 330. Thus, the readout electronics 332 transmit the data from the x-ray detector(s) 322 to the data acquisition system 330. The data acquisition system 330 forms an image from the data and may store, display (on the display 333), and/or transmit the image. For example, the various embodiments may include an image reconstruction module 336, which may be implemented in hardware, software, or a combination thereof, that allows the data acquisition system to reconstruct images using x-ray data (e.g., radiographic or tomosynthesis data) acquired from the x-ray detector(s) 322 and as described in more detail herein.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a floppy disk drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), ASICs, logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, the embodiments are by no means limiting and are exemplary embodiments. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A voltage switching system comprising:
one or more passive resonant modules connected to provide a switching voltage output, each of the plurality of passive resonant modules including:
a plurality of switching devices configured to produce first and second voltage level outputs from a voltage input;
a capacitor connected to the switching devices and configured to receive a system discharge energy during a resonant operating cycle when switching an output voltage from the first voltage level to the second voltage level, wherein the capacitor is further configured to discharge during a resonant operating cycle when switching an output voltage level from the second voltage level to the first voltage level;

a resonant inductor configured to transfer energy to and from the capacitor; and an additional switching device configured to provide the energy into the capacitor at the second voltage level, wherein the additional switching device is connected to the switching devices.

2. The voltage switching system of claim 1, wherein an x-ray tube is connected to an output of the one or more passive resonant modules and configured to operate at two different energy spectra when powered by the first and second voltage levels.

3. The voltage switching system of claim 1, wherein the switching devices are connected in an anti-parallel configuration.

4. The voltage switching system of claim 1, wherein the resonant inductor is connected in series with the capacitor and configured to control a switching speed of the voltage levels.

5. The voltage switching system of claim 1, wherein the switching devices comprise transistors.

6. The voltage switching system of claim 1, wherein the first voltage level is higher than the second voltage level.

7. The voltage switching system of claim 1, wherein the voltage switching system is used in one of a CT system, an x-ray radiographic system, or an x-ray tomosynthesis system.

8. The voltage switching system of claim 1, wherein the switching devices are configured to recirculate the system discharged energy stored in the capacitor during a next resonant operating cycle to switch an output voltage from the second voltage level to the first voltage level.

9. A high voltage generator system comprising:
a voltage source; and
a passive resonant interposer circuit connected to the voltage source, the passive resonant interposer circuit including one or more passive resonant switching modules configured to output two different voltage levels using resonant switching, wherein discharged energy is stored and reused during resonant switching cycles, and the passive resonant switching modules being rechargeable at only one of the voltage levels.

10. The high voltage generator system of claim 9, wherein an x-ray tube is connected to an output of the passive resonant circuit and configured to operate at two different energy levels when powered by the two different voltage levels.

11. The high voltage generator system of claim 10, wherein the passive resonant interposer circuit is integrated with the x-ray tube.

12. The high voltage generator system of claim 9, wherein each of the one or more passive resonant switching modules comprises a capacitor and the passive resonant interposer circuit is configured for passive operation such that the capacitor of each of the resonant switching modules is rechargeable at only a low voltage level.

13. The high voltage generator system of claim 9, wherein the passive resonant interposer circuit is a separate unit being an interposer circuit, the interposer circuit being separate from and coupled to the voltage source.

14. The high voltage generator system of claim 9, wherein the passive resonant interpose circuit is integrated with the voltage source.

15. The high voltage generator system of claim 9, wherein the passive resonant interposer circuit comprises switching devices configured to switch an output between the voltage levels, wherein a switching time for the switching is about 10-100 microseconds or less and further comprising an inductor connected in series with the switching devices to control the switching time.

16. A method for controlling voltage switching, the method comprising:
configuring one or more switching devices to switch states during resonance operation to provide passive resonant voltage switching to output two different voltage levels during one or more resonant switching cycles, wherein the one or more switching devices forming a passive resonant interposer circuit; and
providing a capacitor to store discharged energy during a resonant cycle of the resonance operation and being rechargeable in only one of the two different voltage levels, wherein the stored energy is reused during one or more additional resonant cycles of the resonance operation.

17. The method of claim 16, wherein the method further comprises powering an x-ray tube at the different voltage levels using the one or more switching devices.

18. The method of claim 16, further comprising configuring the one or more switching devices to recirculate the stored energy during the one or more additional resonant cycles.

19. The method of claim 16, wherein the two different voltage levels comprise at least a low voltage level having a voltage output lower than the other one of the voltage levels and the capacitor is rechargeable at only the low voltage level.

20. The method of claim 16, further comprising providing a resonant inductor connected in series with the capacitor, the resonant inductor configured to control a switching speed for switching between the two different voltage levels.

* * * * *